US007023943B1

(12) United States Patent
Guinea et al.

(10) Patent No.: US 7,023,943 B1
(45) Date of Patent: Apr. 4, 2006

(54) DETECTOR FOR DETECTING TIMING IN A DATA FLOW

(75) Inventors: Jesus Guinea, Brembate (IT); Luciano Tomasini, Monza (IT)

(73) Assignee: Stmicroelectronics S.r.l., Agrate Brianza (IT)

( * ) Notice: Subject to any disclaimer, the term of this patent is extended or adjusted under 35 U.S.C. 154(b) by 848 days.

(21) Appl. No.: 09/636,099

(22) Filed: Aug. 10, 2000

(30) Foreign Application Priority Data

Aug. 12, 1999 (EP) ................... 99830524

(51) Int. Cl.
*H04L 7/04* (2006.01)
(52) U.S. Cl. ............ 375/360; 375/371; 370/518; 327/153
(58) Field of Classification Search ........ 375/354–377, 375/355, 360, 371, 373, 326; 370/516, 518, 370/517, 519; 327/144, 153
See application file for complete search history.

(56) References Cited

U.S. PATENT DOCUMENTS 4,677,648 A     6/1987  Zurfluh .................. 375/120
5,548,235 A     8/1996  Marbot ................... 327/158
5,764,092 A     6/1998  Wada et al. ............. 327/271
6,064,707 A *   5/2000  Woodman, Jr. ........... 375/373
6,118,313 A *   9/2000  Yakabe et al. ........... 327/116

FOREIGN PATENT DOCUMENTS

| EP | 153107  | 8/1985 |
| EP | 0499479 | 2/1992 |
| EP | 714190  | 5/1996 |
| EP | 822683  | 2/1998 |

* cited by examiner

*Primary Examiner*—Young T. Tse
(74) *Attorney, Agent, or Firm*—Lisa K. Jorgenson; Allen, Dyer, Doppelt, Milbrath & Gilchrist, P.A.

(57) ABSTRACT

A detector detects timing in a digital data flow with a bit-time equal to T. A first circuit generates four local timing signals each having periods substantially equal to the bit-time. Each of the four local timing signals are out of phase with one another by ¼ period. A second circuit samples the four local timing signals upon each transition of a first type for determining, based upon the sampling, whether two of the four local timing signals forming a pair of reference signals that are out of phase by ½ period are advanced or delayed relative to the timing of the data flow. The second circuit controls the first circuit for delaying or advancing the four local timing signals based upon the pair of reference signals.

24 Claims, 4 Drawing Sheets

DETECTOR FOR DETECTING TIMING IN A DATA FLOW

FIELD OF THE INVENTION

The present invention relates to the field of data-transmission networks, and more particularly, to a synchronous data transmission, particularly in accordance with a synchronous digital hierarchy (SDH) standard. More particularly, the present invention relates to a detector for detecting timing in a data flow.

BACKGROUND OF THE INVENTION

The synchronous digital hierarchy (SDH) standard prescribes the following predetermined transmission rates: 51.84 Mbit/s (base rate), 155.52 Mbit/s, 622.08 Mbit/s, etc. All of the prescribed transmission rates are whole multiples of the base rate.

The G.703 recommendation issued by the CCITT committee of the International Telecommunication Union (ITU) prescribes the electrical and physical characteristics of the hierarchy digital interfaces to be used for interconnecting components of digital networks which conform to the SDH standard. In particular, recommendation G.703 prescribes the type of data coding to be used for each transmission rate. For example, for 155.52 Mbit/s transmission/receiving interfaces, coded mark inversion (CMI) coding should be used. These interfaces are also known as bidirectional or transceiver interfaces.

CMI coding is a coding with two levels, A1<A2, in which a binary 0 is encoded to have the two levels A1 and A2 in succession, each for a time equal to half of the bit-time. A binary 1 is encoded by one of the two levels A1, A2 which is maintained throughout the bit-time. The two levels A1, A2 are alternated for successive binary is. The encoded CMI signal is therefore characterized in that, in the middle of the bit-time, there are no transitions or there are transitions with leading edges. Conversely, at the beginning of the bit-time, there may be either upward or downward transitions.

In general, in data-transmission networks there is a need to synchronize a component of the network with a data flow coming from a remote unit. This need arises, for example, in interfaces which are associated with digital circuits for processing data received and/or to be transmitted and which, typically, operate on data which is encoded differently. For example, the data may be coded in accordance with non-return-to-zero (NRZ) coding.

During receiving, the interface therefore has to receive a signal containing CMI-encoded data from a remote analog interface by a transmission/receiving channel formed, for example, by a pair of coaxial cables. The interface must also recognize the data, convert it into NRZ, and supply it to the digital circuits for processing. During transmission, the interface receives NRZ-encoded data from the digital processing circuits, recognizes the data, converts it into CMI, and provides the data on the transmission/receiving channel.

Timing detectors are used for synchronizing a component of the transmission network, such as an interface of the type described above for a flow of data arriving from a remote unit, for example. Due to the characteristics of CMI coding which, as stated, also has transitions in the middle of the bit-time, known timing detectors require local clock signals with a frequency of twice the frequency of the flow of data arriving, i.e., twice the data rate, to be able to produce the two transitions within the bit-time which are typical of CMI coding. In the example of a 155.52 Mbit/s data flow corresponding to a bit-time of 6.43 ns, the local clock signals have a frequency of 311.04 MHz.

SUMMARY OF THE INVENTION

In view of the foregoing background, it is therefore an object of the present invention to provide a detector for detecting timing in a data flow which does not require local clock signals with a frequency greater than that of the data flow itself.

This and other objects, features and advantages in accordance with the present invention are provided by a detector for detecting timing in a digital data flow with a predetermined bit-time, and with a coding that provides at a beginning of the bit-time no transition, or a transition of a first type, or a transition of a second type, and provides in a middle of the bit-time no transition, or the transition of the first type.

The detector comprises a first circuit for generating four timing signals each having a period substantially equal to the bit-time. The four timing signals are out of phase with one another by ¼ period. A second circuit samples the four timing signals upon each transition of the first type in the data flow, and determines based upon the sampling whether two of the four timing signals forming a pair of reference signals that are out of phase by ½ period are advanced or delayed relative to the timing of the data flow. The second circuit also controls the first circuit to delay or advance the four timing signals based upon the pair of reference signals.

The second circuit comprises a sampling circuit, and a decoding circuit connected to the sampling circuit for decoding the sampled four timing signals. The sampling circuit preferably comprises four bistable elements, each bistable element being associated with a respective timing signal and being clocked by the transitions of the first type in the data flow. The decoding circuit preferably comprises a logic circuit connected to respective outputs of the four bistable elements for determining whether the pair of reference signals is advanced or delayed relative to the timing of the data flow.

BRIEF DESCRIPTION OF THE DRAWINGS

The characteristics and the advantages of the present invention will become clearer from the following detailed description of an embodiment thereof, illustrated purely by way of a non-limiting example in the appended drawings, in which.

DETAILED DESCRIPTION OF THE PREFERRED EMBODIMENTS

Figure 1:
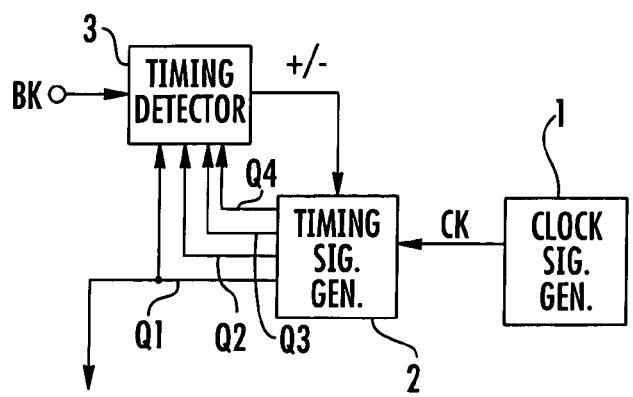
FIG. 1 is a block diagram of a circuit comprising a timing detector for detecting the timing in a data flow according to the present invention.

With reference to FIG. 1, a circuit for detecting timing in a data flow BK comprises a circuit 1 for generating a local clock signal CK. The local clock signal CK is supplied to a circuit 2 to obtain, from the signal, four local timing signals Q1, Q2, Q3, Q4 having the same period T. This period is equal or substantially equal to the bit-time of the data flow BK. The signals Q1–Q4 are out of phase with one another by T/4. The signal Q2 is delayed by T/4 relative to the signal Q1. The signal Q3 is delayed by T/4 relative to the signal Q2, and by T/2 relative to the signal Q1. That is, the signal Q3 is in quadrature relative to the signal Q2. The signal Q4 is delayed by T/4 relative to the signal Q3.

The four signals Q1–Q4 are supplied to a timing detector 3 which also receives the data flow BK, the timing of which is to be detected. The detector 3 generates a signal +/− which is supplied to the circuit 2. A first level of the signal +/− indicates to the circuit 2 that the signal Q1 is delayed relative to the timing of the data flow BK and should be advanced. Conversely, a second level of the signal +/− indicates to the circuit 2 that the signal Q1 is advanced relative to the timing of the data flow BK and should be delayed.

If the signal Q1 is advanced or delayed, the signals Q2–Q4 are also consequently advanced or delayed. Their delays relative to the signal Q1 are kept constant. Once the signal Q1 is synchronized with the timing of the data flow BK, it can be used by other circuit blocks to perform processing on the data flow BK. An example of using signal Q1 is provided below.

Figure 2:
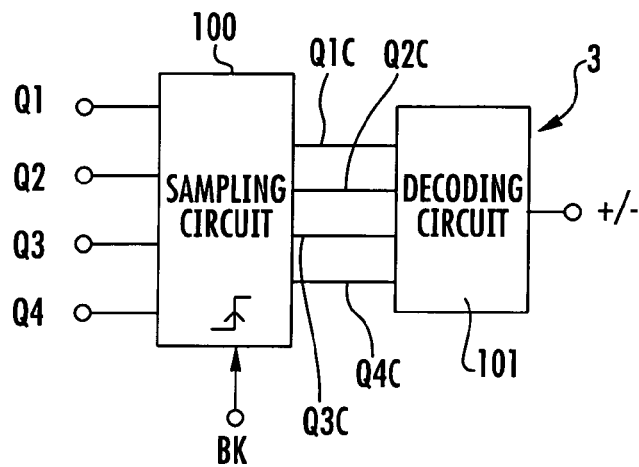
FIG. 2 is a block diagram of the timing detector according to the present invention.

FIG. 2 shows a block diagram of the circuit 3 of FIG. 1. The timing detector comprises a sampling circuit 100 which samples the four signals Q1–Q4 in synchronization with the leading edges of the signal BK, and supplies sampled signals Q1C–Q4C to a decoding circuit 101 which decodes the states of the sampled signals Q1C–Q4C to activate the signal +/−.

Figure 3:
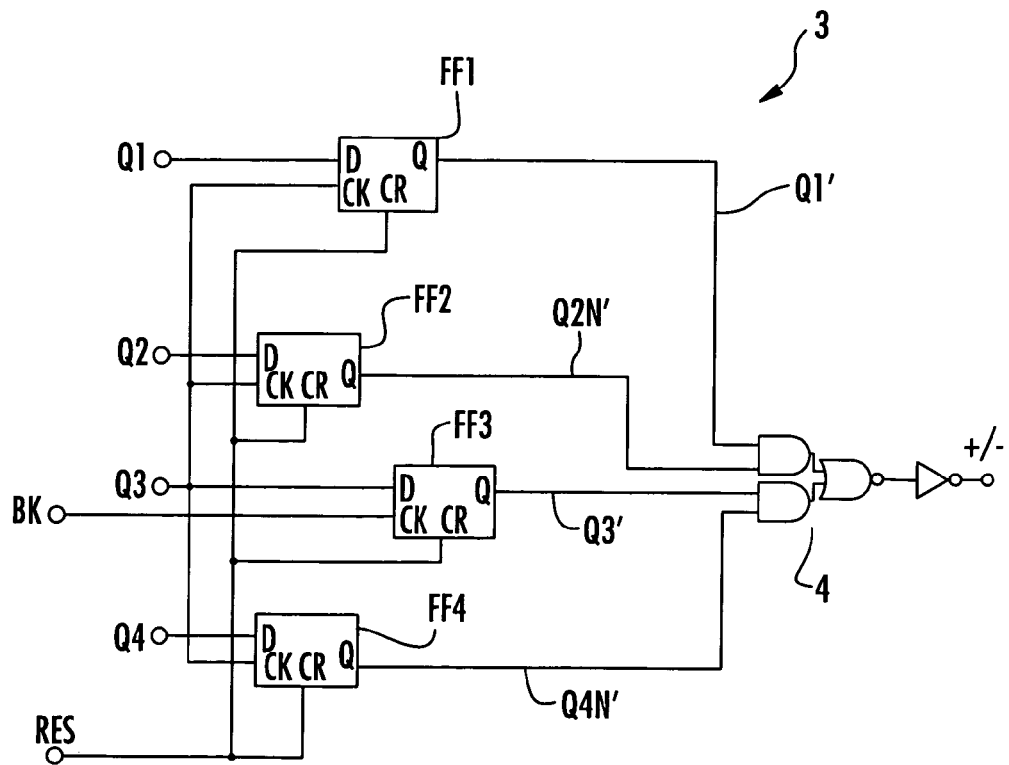
FIG. 3 is a schematic diagram of one embodiment of the timing detector illustrated in FIG. 2.

An implementation of the circuit of FIG. 2, which is in no way limiting, is shown in FIG. 3. The circuit comprises four D-type flip-flops FF1–FF4 which receive the signals Q1–Q4 at their respective data inputs D, whereas their sampling inputs receive in common the data flow BK. A reset signal RES is also supplied to the reset inputs of the flips-flops FF1–FF4 for re-establishing certain starting conditions.

The output Q1', the negated output Q2N' of the flip-flops FF1 and FF2, the output Q3', and the negated output Q4N' of the flip-flops FF3, FF4 are supplied to an AND-NOR-INVERTER logic gate 4. The logic complement of the output of the logic gate 4 forms the signal +/−.

The circuit of FIG. 3 performs the logic function:

+/−=Q1' AND Q2N' OR Q3' AND Q4N'

After the flip-flops have been loaded with the values applied to their inputs, Q1', Q2N', Q3', Q4N' are respectively equal to Q1, Q2N, Q3, Q4N.

Since, one of the signals Q1 and Q3 and one of the signals Q2 and Q4 is always complementary to the respective other signal, the circuit of FIG. 3 has the following truth table:

| Q4 | Q3 | Q2 | Q1 | +/− |
|----|----|----|----|-----|
| 0  | 0  | 1  | 1  | 0   |
| 0  | 1  | 1  | 0  | 1   |
| 1  | 0  | 0  | 1  | 1   |
| 1  | 1  | 0  | 0  | 0   |

Figure 4:
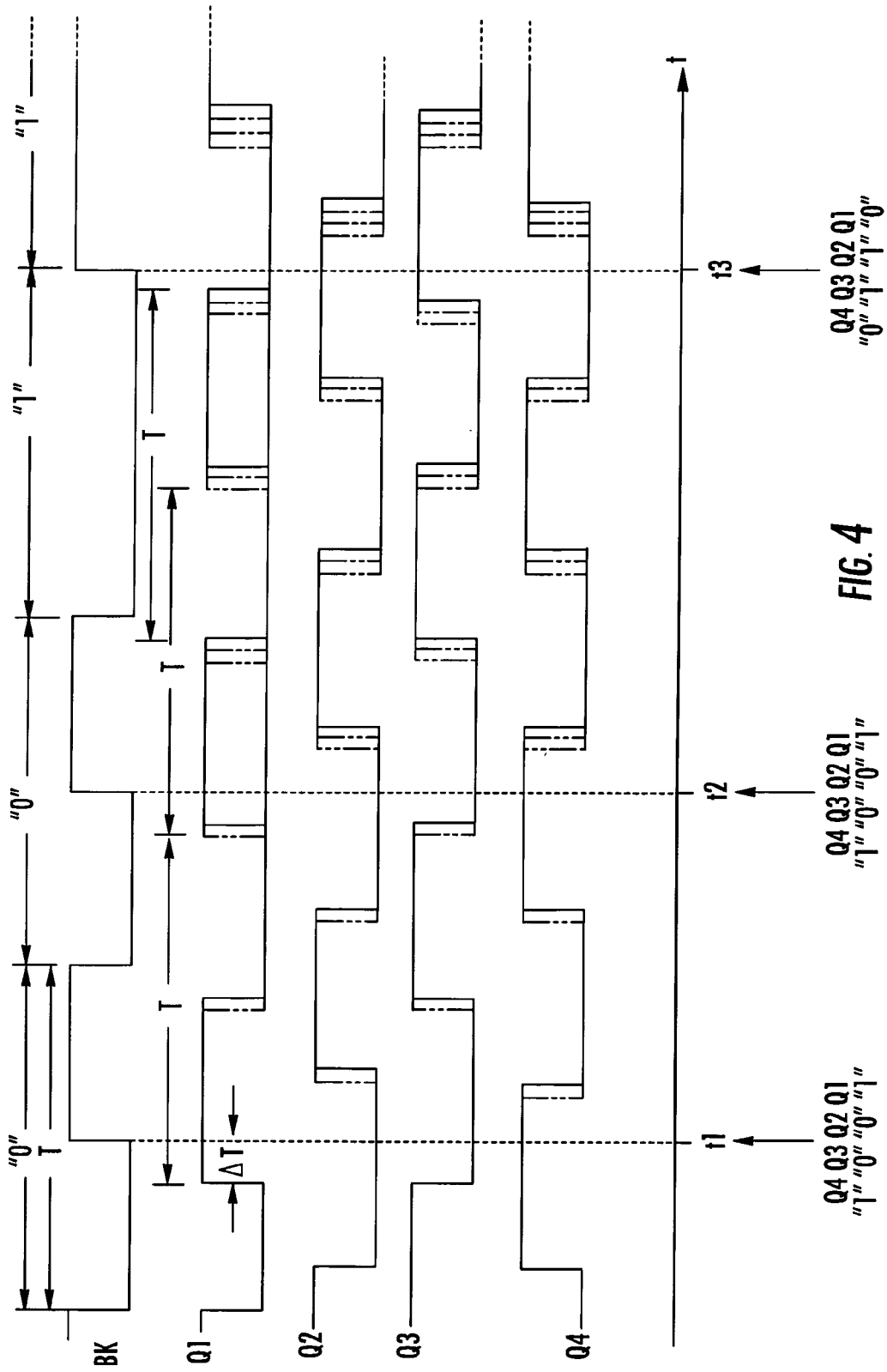
FIG. 4 is a graph illustrating the operating principle of the timing detector according to the present invention.

The operating principle of the above-described timing detector will now be explained with reference to the timing graph of FIG. 4. The data flow BK acts as a sampling signal for the flip-flops FF1–FF4. At the leading edges of the signal BK, the logic states applied to the inputs D of the flip-flops FF1–FF4 are stored and supplied as outputs. Prior to the time instant t1, the four signals Q1–Q4 are assumed to be represented by the continuous lines. The signal Q1, which is to be synchronized with the timing of the data flow BK, is advanced by Δt.

At the leading edge of the signal BK (time instant t1) which, in the example shown, is formed by the transition in the middle of the bit-time typical of a logic 0 signal. The states of the signals are Q1=1, Q2=0, Q3=0, and Q4=1. On the basis of the truth table given above, the above-mentioned states correspond to signal +/−=1 which indicates to the circuit 2 that the signal Q1 is advanced and should be delayed.

The circuit 2 consequently provides for the signal Q1 and, correspondingly, for the signals Q2–Q4 to be delayed. The lines with single dots in FIG. 4 indicate the edges of the signals Q1–Q4 as they would be if the circuit 2 did not intervene to delay them.

At the time instant t2 corresponding to the next leading edge of the signal BK which, in the example, is again the transition in the middle of a bit-period of a logic 0 signal. The signal Q1 is still advanced relative to the data flow BK. The flip-flops FF1–FF4 sample and load the new states of the signals Q1–Q4. Since the new state coincides with the previous one, the signal +/− generated is again a 1, and the circuit 2 therefore once more provides for the signal Q1 and, consequently, for the signals Q2–Q4 to be delayed. In FIG. 4, the lines with double dots indicate the edges of the signals Q1–Q4 as they would be after the first intervention of the circuit 2.

The next leading edge of the signal BK at the time instant t3, which corresponds to a logic 1 signal, is at the beginning of the bit-time. The flip-flops FF1–FF4 sample the new state of the signals Q1–Q4 which, on the basis of the truth table given above, again correspond to a logic 1 on the signal +/−. The four signals Q1–Q4 are therefore delayed again. At the instant t3, the signals Q3 and Q4 are utilized for locking onto the transition at the beginning of the bit-time.

The signals Q1 and Q3 are thus progressively and dynamically kept in synchronization with the leading edges of the signal BK. The synchronization is both at the beginning and in the middle of the bit-time. Locking with the timing of the data flow is thus achieved. The signals Q1 and Q3 may be used by other circuit blocks for synchronizing the blocks with the timing of the data flow that is arriving. The signals Q2 and Q4 may be used by the circuit blocks to perform sampling of the data flow every half bit-time.

An advantage of the timing detector according to the present invention is that it does not require local timing signals with a frequency of twice the bit frequency of the data flow, the timing of which is to be detected. The four signals Q1–Q4, which are out of phase with one another by one quarter of the bit-time, and all of the transitions of the CMI-coded signal with leading edges may be used for synchronization. That is, both the transitions at the beginning of the bit-time (corresponding to logic 1 signals) and those in the middle of the bit-time (corresponding to logic 0 signals) may be used. For example, the signals Q1 and Q2 serve for locking with the transitions in the middle of the bit-time, and the signals Q3 and Q4 serve for locking with the transitions at the beginning of the bit-time.

Although in the example described, the four signals Q1–Q4 have duty cycles equal to 50%. The use of the four signals Q1–Q4 which are out of phase by one quarter of the bit-time also enables the timing detector to operate independently of the duty cycle of the local timing signals Q1–Q4, and to be insensitive to changes in the duty cycle of the signals Q1–Q4.

Figure 5:
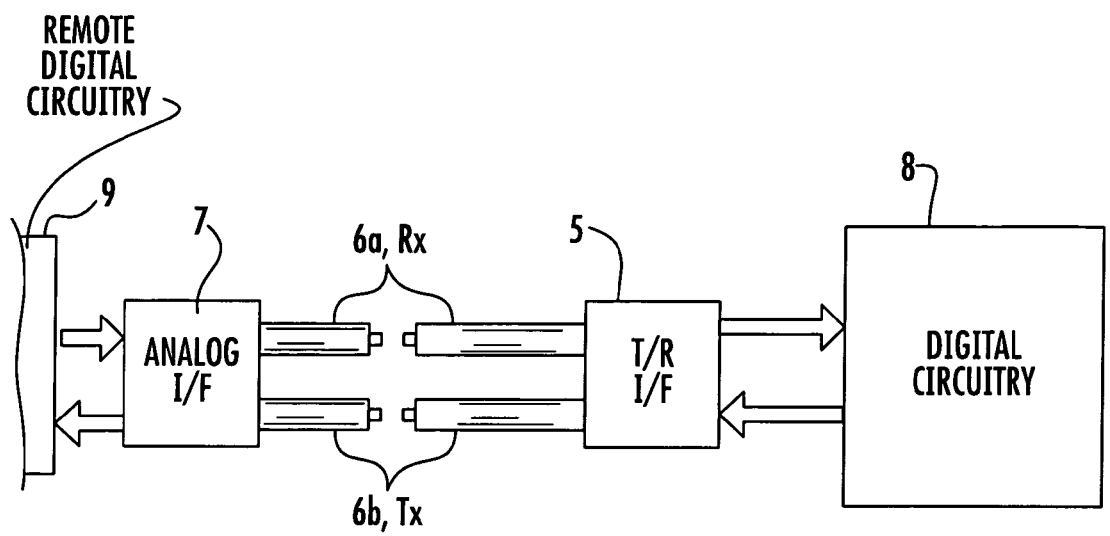
FIG. 5 is a block diagram of a data-transmission network including a timing detector according to the present invention.
Figure 6:
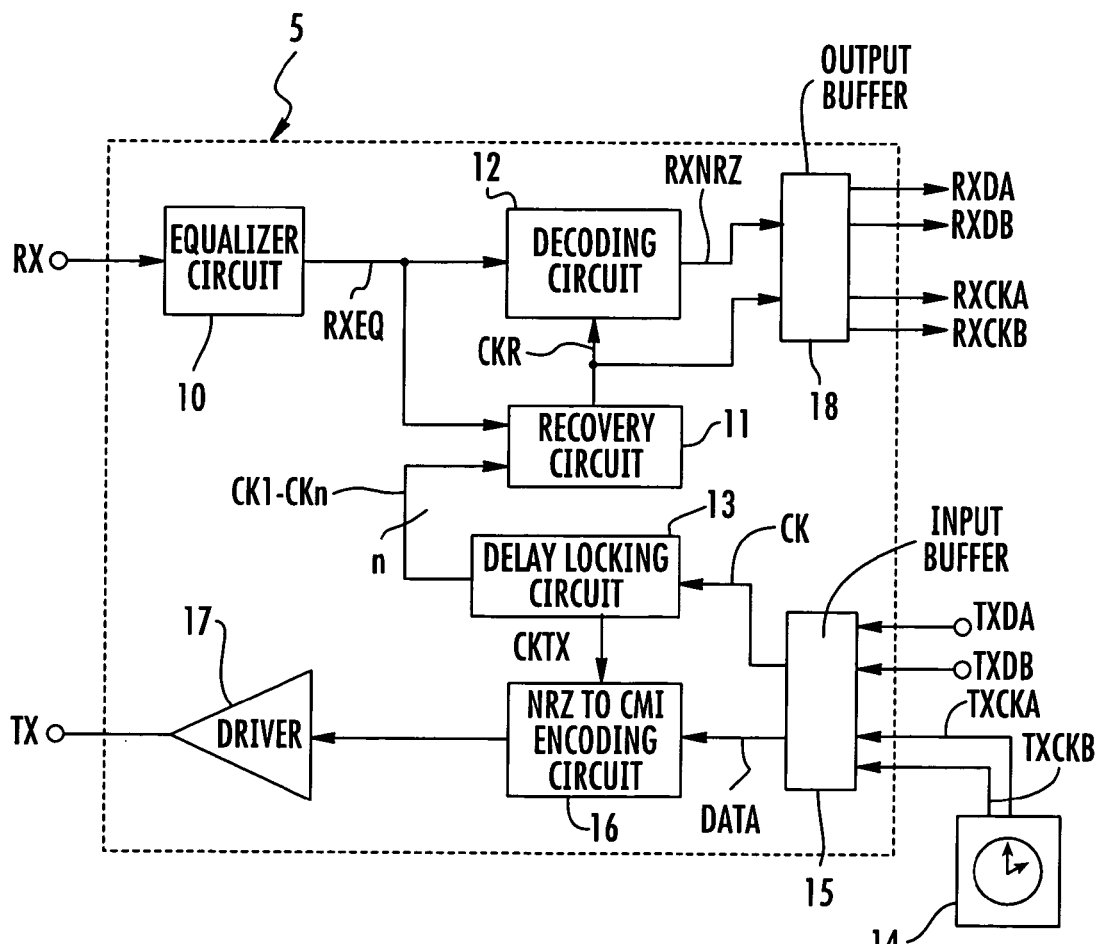
FIG. 6 is a block diagram of a receiving/transmission interface included in the network illustrated in FIG. 4.
Figure 7:
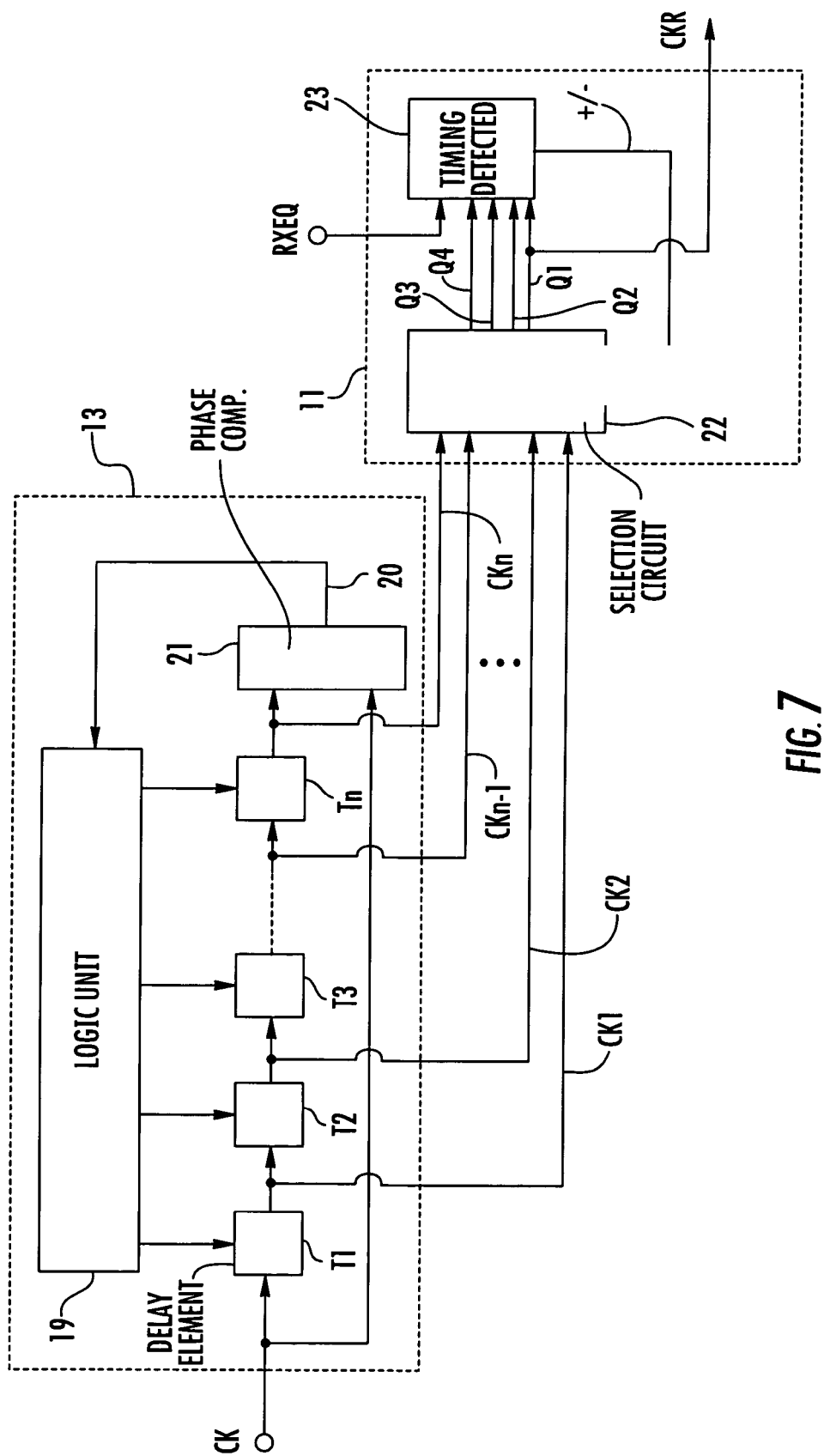
FIG. 7 is a block diagram in greater detail of two functional blocks of the interface illustrated in FIG. 6, one of which includes a timing detector according to the present invention.

The following FIGS. 5–7 illustrate one possible application of the timing detector according to the present invention. FIG. 5 shows schematically a data-transmission network, and in particular, a network conforming to the synchronous digital hierarchy (SDH) standard. A bidirectional, synchronous interface 5, i.e., a transmission and receiving interface, receives digital data with CMI coding from a remote far end analog interface 7 on a first channel 6a, such as a coaxial cable, for example.

The interface 5 in turn transmits a flow of digital data with CMI coding to the remote interface 7 on a second channel 6b also formed, for example, by a coaxial cable. For the interface 5, the channel 6a is the receiving channel (RX), and the channel 6b is the transmission channel (TX). The interface 5 communicates with digital circuitry 8 for processing the data received and to be transmitted. Similarly, the remote interface 7 is associated with respective digital circuitry 9.

As shown in FIG. 6, the interface 5 comprises an equalizer circuit 10 for module and phase equalization of the signal received on the receiving channel RX. A signal RXEQ output from the equalizer circuit 10 with CMI coding is supplied in parallel to a circuit 11 for recovering the timing signal during receiving, and to a decoding circuit 12. The decoding circuit 12 decodes the CMI-coded signal RXEQ into a corresponding signal RXNRZ with NRZ coding, for example, that is suitable for supply to the digital circuitry 8.

The circuit 11 for recovering the timing signal during receiving also receives n timing signals CKL–CKn of equal period T, delayed relative to one another by T/n, where T is the bit-time. In the case of a 155.52 Mbit/s synchronous receiving/transmission interface, the bit-time is about 6.43 ns. For example, there are sixteen signals CK1–CKn, with a signal CKi+1 being delayed by T/16 relative to a signal CKi. The signals CK1–CKn are generated by a delay locking circuit 13 or a delay locked loop (DLL) supplied with a clock signal CK of period T.

The clock signal CK is in turn generated by a local circuit 14 which generates a pair of differential signals TXCKA, TXCKB conforming to the low voltage differential signal levels (LVDS) which are transformed into the signal CK conforming to the CMOS levels (e.g., 3.3 V or 5 V) by an LVDS/CMOS input buffer 15. The circuit 14 may, for example, be within the digital circuitry 8 and is used to generate a pair of differential signals TXDA, TXDB representing the flow of bits to be transmitted.

The NRZ-coded signals TXDA, TXDB are transformed by the input buffer 15 into a signal DATA. This signal DATA is still NRZ-coded and is transformed by an NRZ to CMI encoding circuit 16 synchronized with a timing signal CKTX. The timing signal is generated by the digital circuitry 8, and has a frequency equal to that of the signal CK, but a duty cycle which is guaranteed to be substantially equal to 50%. A subsequent driver circuit 17 receives the signal from the encoding circuit 16 and provides the signal TX to be transmitted.

The circuit 11 for recovering the timing signal during receiving generates a recovered timing signal CKR which is supplied to the decoding circuit 12. This circuit has to be synchronized with the flow of bits received to be able to decode the CMI signal to NRZ.

The signal RXNRZ and the signal CKR are also supplied to the digital circuitry 8 after their levels have been transformed from CMOS to LVDS by a CMOS/LVDS output buffer 18. This output buffer 18 is similar to the input buffer 15, and transforms the signal RXRNZ into a pair of differential signals RXDA, RXDB and the signal CKR into a pair of differential signals RXCKA, RXCKB.

FIG. 7 shows the delay locking circuit 13 and the timing-signal recovery circuit 11 in greater detail. The circuit 13 is composed of a chain of n (e.g., n=16) delay elements T1–Tn in cascade. These delay elements are controlled by a logic unit 19 which receives an output signal 20 from a phase comparator 21. The chain of delay elements T1–Tn form a controlled delay line. The overall delay introduced by the delay line T1–Tn is controlled so that the delay is equal to one period T of the signal CK.

The phase comparator 21 receives as inputs and compares the signal CK and the signal CKn at the output of the last delay element Tn of the chain. The output signal 20 of the phase comparator 21 depends on the phase difference detected between the signals CK and Ckn. The logic unit 19 controls the delay elements T1–Tn so that the delay introduced by each of delay elements is such that the signal CKn is in phase the with signal CK, less one period T.

The outputs CK1–CKn of the n delay elements T1–Tn are supplied to a selection circuit 22. The selection circuit 22 is basically a multiplier in the recovery circuit 11. Of the n (n=16 in the example) input signals CK1–CKn, the multiplier 22 outputs four signals Q1–Q4 delayed relative to one another by T/4. The four signals Q1–Q4 are supplied to a timing detector 23 according to the present invention.

The timing detector 23 is of the type described above, which also receives the signal RXEQ with CMI coding. The timing detector 23 controls the selector 22 by the signal +/− as described above, in a manner such that the signal Q1, which corresponds to the signal CKR that is supplied to the decoder 12, is synchronized with the data flow during receiving.

The clock signal is thus recovered from the signal received and can be supplied to the CMI to NRZ decoding circuit 12. In other words, during receiving, the interface is synchronized with the flow of data received. The interface described has the advantage of requiring only one local timing signal, i.e., a single time base, which is used both for transmission and for the recovery of the clock signal during receiving.

The timing of the interface both during receiving and during transmission is thus entrusted to a single time base. This eliminates the need to provide two local oscillators with frequencies close to one another, and hence the risk of crosstalk between the two timing signals. A saving in terms of components and power absorbed is also achieved. Variations of and/or additions to the embodiments described above and illustrated may be provided, without departing from the scope of the present invention.

What is claimed is:

1. A detector for detecting timing in a data flow with a bit-time, and with a coding that provides at a beginning of the bit-time no transition, or a transition of a first type, or a transition of a second type, and provides in a middle of the bit-time no transition, or the transition of the first type, the transition of the first type being one transition between an upward transition and a downward transition and the transition of the second type being opposite the transition of the first type, the detector comprising:
  a first circuit for generating four local timing signals each having a period substantially equal to the bit-time, the four local timing signals being out of phase with one another by ¼ period; and
  a second circuit for sampling the four local timing signals upon each transition of the first type in the data flow, and for determining based upon sampling whether two of the four local timing signals forming a pair of reference signals that are out of phase by ½ period are advanced or delayed relative to the timing of the data flow, and for controlling said first circuit to delay or advance the four local timing signals based upon the pair of reference signals.

2. A detector according to claim 1, wherein the coding comprises a coded mark inversion coding.

3. A detector according to claim 1, wherein said second circuit comprises:
  a sampling circuit; and
  a decoding circuit connected to said sampling circuit for decoding the sampled four local timing signals, and connected to said first circuit for control thereof.

4. A detector according to claim 3, wherein said sampling circuit comprises four bistable elements, each bistable element being associated with a respective timing signal and being clocked by the transitions of the first type in the data flow; and wherein said decoding circuit comprises a logic circuit connected to respective outputs of said four bistable elements for determining whether the pair of reference signals are advanced or delayed relative to the timing of the data flow.

5. A detector according to claim 4, wherein each one of said bistable elements comprises a D-type flip-flop; and wherein said logic circuit comprises a pair of AND gates connected to the outputs of said four bistable elements, a NOR gate connected to respective outputs of said pair of AND gates, and an INVERTER connected to an output of said NOR gate.

6. A detector for detecting timing in a data flow comprising:
  a first circuit for generating four local timing signals each having a period substantially equal to a bit-time of the data flow, the four local timing signals being out of phase with one another by ¼ period; and
  a second circuit for determining based upon a sampling of the four local timing signals whether two of the four local timing signals forming a pair of reference signals that are out of phase by ½ period are advanced or delayed relative to the timing of the data flow, and for controlling said first circuit to delay or advance the four local timing signals based upon the pair of reference signals.

7. A detector according to claim 6, wherein the data flow comprises coding for providing at a beginning of the bit-time no transition, or a transition of a first type, or a transition of a second type, and providing in a middle of the bit-time no transition, or the transition of the first type, the transition of the first type being one transition between an upward transition and a downward transition and the transition of the second type being opposite the transition of the first type.

8. A detector according to claim 7, wherein the coding comprises a coded mark inversion coding.

9. A detector according to claim 7, wherein said second circuit comprises:
  a sampling circuit for sampling the four local timing signals upon each transition of the first type in the data flow; and
  a decoding circuit connected to said sampling circuit for decoding the sampled four local timing signals.

10. A detector according to claim 9, wherein said sampling circuit comprises four bistable elements, each bistable element being associated with a respective timing signal and being clocked by the transitions of the first type in the data flow; and wherein said decoding circuit comprises a logic circuit connected to respective outputs of said four bistable elements for determining whether the pair of reference signals are advanced or delayed relative to the timing of the data flow.

11. A detector according to claim 10, wherein each one of said bistable elements comprises a D-type flip-flop; and wherein said logic circuit comprises a pair of AND gates connected to the outputs of said four bistable elements, a NOR gate connected to respective outputs of said pair of AND gates, and an INVERTER connected to an output of said NOR gate.

12. A data transmission network comprising:
  a processing circuit for processing data;
  a transmission medium; and
  an interface circuit connected between said processing circuit and said transmission medium for interfacing a data flow therebetween, said interface circuit comprising a detector for detecting timing in the data flow, said detector comprising
    a first circuit for generating four local timing signals each having a period substantially equal to a bit-time of the data flow, the four local timing signals being out of phase with one another by ¼ period, and
    a second circuit for determining based upon a sampling of the four local timing signals whether two of the four local timing signals forming a pair of reference signals that are out of phase by ½ period are advanced or delayed relative to the timing of the data flow, and for controlling said first circuit to delay or advance the four local timing signals based upon the pair of reference signals.

13. A data transmission network according to claim 12, wherein the data flow comprises coding for providing at a beginning of the bit-time no transition, or a transition of a first type, or a transition of a second type, and providing in a middle of the bit-time no transition, or the transition of the first type, the transition of the first type being one transition between an upward transition and a downward transition and the transition of the second type being opposite the transition of the first type.

14. A data transmission network according to claim 13, wherein the coding comprises a coded mark inversion coding.

15. A data transmission network according to claim 12, further comprising a remote interface circuit connected to said transmission medium for receiving the data flow from said interface circuit and for transmitting the data flow to said interface circuit.

16. A data transmission network according to claim 12, wherein said processing circuit and said interface circuit conform to a synchronous digital hierarchy.

17. A data transmission network according to claim 12, wherein said second circuit comprises:

a sampling circuit for sampling the four local timing signals upon each transition of a first type in the data flow, the transition of the first type being one transition between an upward transition and a downward transition; and a decoding circuit connected to said sampling circuit for decoding the sampled four local timing signals.

18. A data transmission network according to claim 17, wherein said sampling circuit comprises four bistable elements, each bistable element being associated with a respective timing signal and being clocked by the transitions of the first type in the data flow; and wherein said decoding circuit comprises a logic circuit connected to respective outputs of said four bistable elements for determining whether the pair of reference signals are advanced or delayed relative to the timing of the data flow.

19. A data transmission network according to claim 18, wherein each one of said bistable elements comprises a D-type flip-flop; and wherein said logic circuit comprises a pair of AND gates connected to the outputs of said four bistable elements, a NOR gate connected to respective outputs of said pair of AND gates, and an INVERTER connected to an output of said NOR gate.

20. A method for detecting timing in a data flow comprising:

generating four local timing signals each having a period substantially equal to a bit-time of the data flow, the four local timing signals being out of phase with one another by ¼ period;

sampling the four local timing signals upon each transition of a first type in the data flow, the transition of the first type being one transition between an upward transition and a downward transition;

determining based upon the sampling whether two of the four local timing signals forming a pair of reference signals that are out of phase by ½ period are advanced or delayed relative to the timing of the data flow; and delaying or advancing the four local timing signals based upon the pair of reference signals.

21. A method according to claim 20, wherein the data flow comprises coding for providing at a beginning of the bit-time no transition, or the transition of the first type, or a transition of a second type, and providing in a middle of the bit-time no transition, or the transition of the first type, the transition of the second type being opposite the transition of the first type.

22. A method according to claim 21, wherein the coding comprises a coded mark inversion coding.

23. A method according to claim 20, wherein after the sampling of the four local timing signals the method further comprises decoding the sampled four local timing signals.

24. A method according to claim 23, wherein the sampling is performed by a sampling circuit comprising four bistable elements, each bistable element being associated with a respective timing signal and being clocked by the transitions of the first type in the data flow; and wherein the decoding is performed using a logic circuit connected to respective outputs of the four bistable elements for determining whether the pair of reference signals are advanced or delayed relative to the timing of the data flow.

* * * * *